US009088122B2

(12) United States Patent
Moto

(10) Patent No.: US 9,088,122 B2
(45) Date of Patent: Jul. 21, 2015

(54) DRIVER FOR LASER DIODE INTEGRATED WITH EXTERNAL MODULATOR

(75) Inventor: Akihiro Moto, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 81 days.

(21) Appl. No.: 13/547,090

(22) Filed: Jul. 12, 2012

(65) Prior Publication Data

US 2013/0016745 A1 Jan. 17, 2013

(30) Foreign Application Priority Data

Jul. 13, 2011 (JP) ................................ P2011-154851

(51) Int. Cl.
H01S 3/00 (2006.01)
H01S 5/026 (2006.01)
H01S 5/042 (2006.01)
H01S 5/00 (2006.01)
H01S 5/062 (2006.01)
H01S 5/12 (2006.01)

(52) U.S. Cl.
CPC ............. *H01S 5/0265* (2013.01); *H01S 5/0085* (2013.01); *H01S 5/042* (2013.01); *H01S 5/0428* (2013.01); *H01S 5/0264* (2013.01); *H01S 5/06226* (2013.01); *H01S 5/12* (2013.01)

(58) Field of Classification Search
CPC ................ H01S 5/0085; H01S 5/0265; H01S 5/0425–5/0428; H01S 5/12
See application file for complete search history.

(56) References Cited

U.S. PATENT DOCUMENTS

| 5,546,218 | A | * | 8/1996 | Komatsubara et al. | ........ 359/237 |
| 5,604,827 | A | * | 2/1997 | Yamaguchi | ........................ 385/1 |
| 6,014,392 | A | * | 1/2000 | Imai et al. | .................. 372/38.02 |
| 6,044,097 | A | * | 3/2000 | Kawamura et al. | ........ 372/38.01 |
| 2003/0180054 | A1 | * | 9/2003 | Watanabe et al. | ............. 398/182 |

FOREIGN PATENT DOCUMENTS

| JP | H7-074420 | 3/1995 |
| JP | H10-233543 | 9/1998 |
| JP | H11-119176 | 4/1999 |
| JP | 2000-199879 | 7/2000 |
| JP | 2003-149613 | 5/2003 |

OTHER PUBLICATIONS

Japanese Office Action issued on Mar. 3, 2015 for Application No. P2011-154851 w/ English language translation.

* cited by examiner

*Primary Examiner* — Julio J Maldonado
*Assistant Examiner* — Sean Hagan
(74) *Attorney, Agent, or Firm* — Smith, Gambrell & Russell LLP.

(57) ABSTRACT

A driver for an EA-DFB device includes a switching device. The EA-DFB device is put between a positive power supply and a negative power supply as connected in series to a bias current source and the switching device. The EA device is modulated by the switching device in the differential mode. The switching device includes paired transistors each having a load, one of which is a resistor connected in parallel to the EA device, while, the other is constituted by a resistive element.

11 Claims, 9 Drawing Sheets

US 9,088,122 B2

DRIVER FOR LASER DIODE INTEGRATED WITH EXTERNAL MODULATOR

BACKGROUND OF THE INVENTION

1. Field of the Invention

The present invention relates to a driver circuit for a semiconductor laser diode (hereafter denoted as LD) with an external modulator, in particular, the invention relates to a driver for a distributed feedback (hereafter denoted as DFB) LD integrated with an electro-absorption (hereafter denoted as EA) modulator, which is often called as EA-DFB.

2. Related Background Art

An EA-DFB has been applied to the optical communication system. The EA-DFB integrates the DFB with the EA within one chip. The DFB may generate light by supplying a current thereto, while, the EA may modulate light depending on bias conditions applied thereto. The EA-DFB generally has a cathode electrode, hereafter denoted as ComC terminal, common to the EA device and the DFB device, while, the anode of the EA device is independent of the anode of the DFB device. Thus, the EA-DFB has a device with three electrodes. Japanese Patent Applications published as JP-2000-199879A and another applications published as JP-2003-149613A have disclosed drivers to drive the EA-DFB.

SUMMARY OF THE INVENTION

One aspect of the present application relates to a driver circuit for a light-emitting device that includes an ED of a type of a DFB integrated with an EA modulator, which constitute an EA-DFB device. The EA-DFB device of an embodiment includes a switching unit connected in series to the EA-DFB device between a positive power supply and a negative power supply. The switching unit of an embodiment includes a first current path and a second current path. The former path includes a resistor and a first transistor, while, the latter path includes a second transistor. A feature of the driver of the embodiment is that the resistor in the first current path is connected in parallel to the EA, and the first and second transistors are driven in the differential mode, or driven in complementary to each other.

In case where the first and second transistors are fully turned on or off, the current flowing in the DFB flows in a whole portion thereof in the resistor when the first transistor is fully turned on while the second transistor is fully turned off, which causes a voltage drop in the resistor to bias the EA negatively. On the other hand, when the second transistor is fully turned on, while, the first transistor is fully turned off, the current flowing in the DFB fully flows in the second transistor, which causes no bins to the EA. Thus, the EA may be biased on or off by the current flowing in the DFB, which may modulate light emitted from the DFB. Thus, the driver according to an embodiment of the invention may drive the EA by the current flowing in the DFB, which may reduce the power consumption not only of the driver but a circuit provided in the upstream of the driver.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, some embodiments of a driver for an LD with an external modulator will be described as referring to drawings. In the description of the drawings, the numerals or symbols same or similar to each other will refer to the elements same or similar to each other without overlapping explanations.

Figure 1:
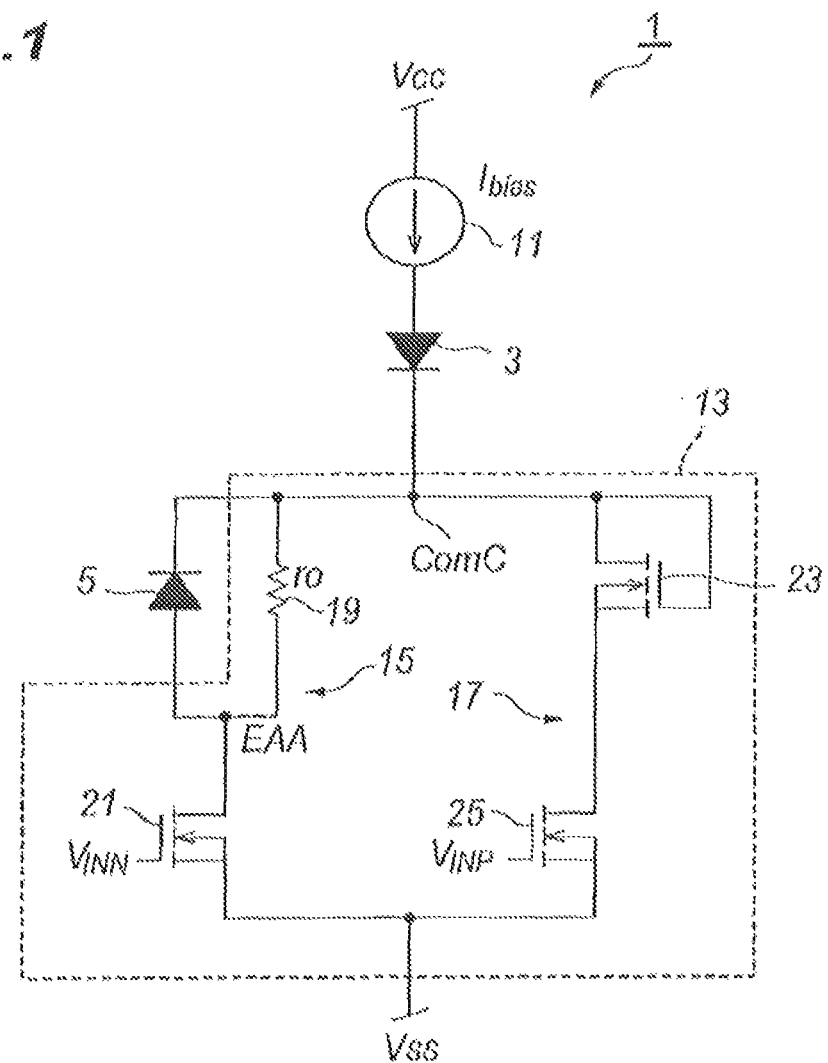
FIG. 1 shows a primary portion of a driver for an EA-DFB device according to on embodiment of the invention.

FIG. 1 shows a circuit diagram showing a primarily portion of a driver for an LD with an external modulator according to the first embodiment of the invention. The driver 1 shown in FIG. 1 is a circuit for an LD with the type of, what is called, EA-DFB including a DFB-LD 3 and an EA 5. The driver 1 includes a bins current source 11 and a switching unit 13, where they are connected in series between the positive power supply Vcc and the negative power supply Vss as putting the DFB 3 therebetween.

The bias current source 11 connected to the anode of the DFB 3 in an output thereof may provide a bias current $I_{bias}$ to the DFB 3 and the switching unit 13. The switching unit 13 includes two current paths, 15 and 17, connected in parallel to each other. One of the current paths 15 includes a resistor 19, which is connected in parallel to the EA 5, and a first n-type MOSFET 21. The other of the current paths 17 includes an n-type MOSFET 23, where the gate is connected to the drain thereof to configure the diode connection, and a second n-type MOSFET 25. The first MOSFET 21 and the second MOSFET 25 are driven in the differential mode, that is, the gates thereof receive respective signals, $V_{INN}$ and $V_{INP}$, complementary to each other.

Figure 2:
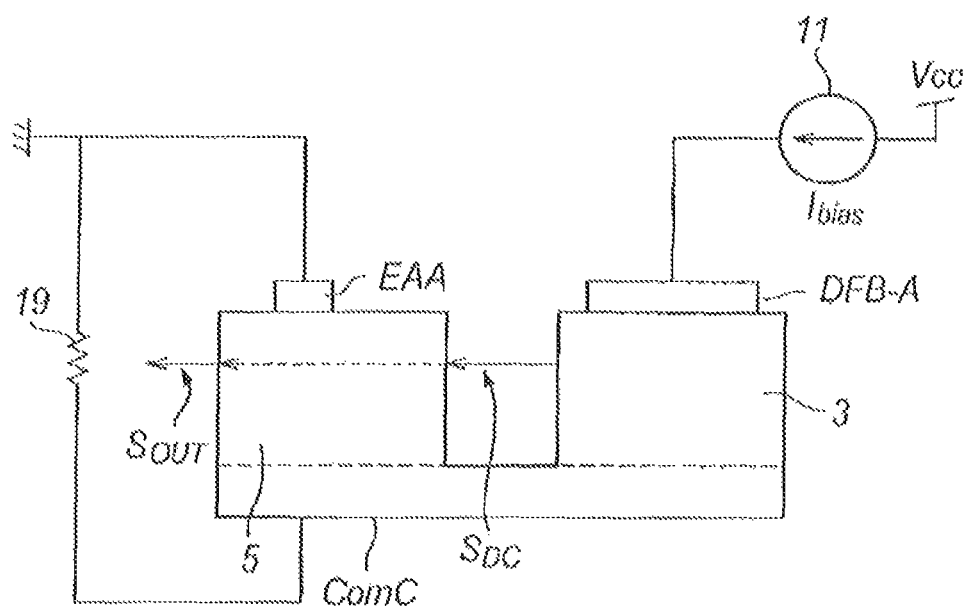
FIG. 2 schematically shows a cross section of an EA-DFB device and a mechanism to generate modulated light.

FIG. 2 schematically illustrates the EA-DFB device including the DFB 3 and the EA 5. Receiving the bias current $I_{bias}$ in the anode of the DFB 3, which is indicated by DFB-A in FIG. 2, from the bias current source 11, the DFB 3 may emit light $S_{DC}$ to the EA 5. While in the EA 5, the resistor 19 may cause a bias voltage $V_{bias}$ between the common cathode ComC and the anode of the EA 5, indicated by EAA in FIG. 2, by a current flowing therein. The EA 5 may absorb a portion of the light $S_{DC}$ coming from the DFB 3 and coupled with the EA 5 depending on the bias voltage $V_{bias}$, and may emit rest portions of the light as an optical output $S_{OUT}$. The EA 5 may generate a photocurrent depending on the absorbed portion of the light between two electrodes, EAA and ComC. An AC signal may be applied between two electrodes, EAA and ComC, by the switching unit 13 to modulate the absorption in the EA 5 to generate a modulated optical output $S_{OUT}$.

Figure 3A:
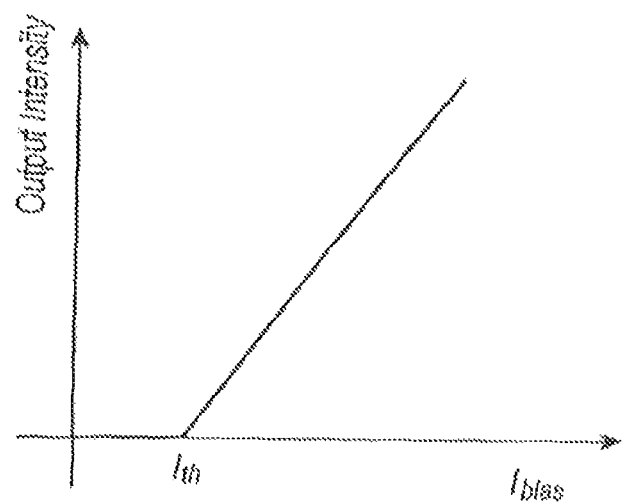
FIG. 3A is a fundamental characteristic, what is called as, the I-L characteristic of the DFB, while, FIG. 3B explains a mechanism to modulate by the EA.
Figure 3B:
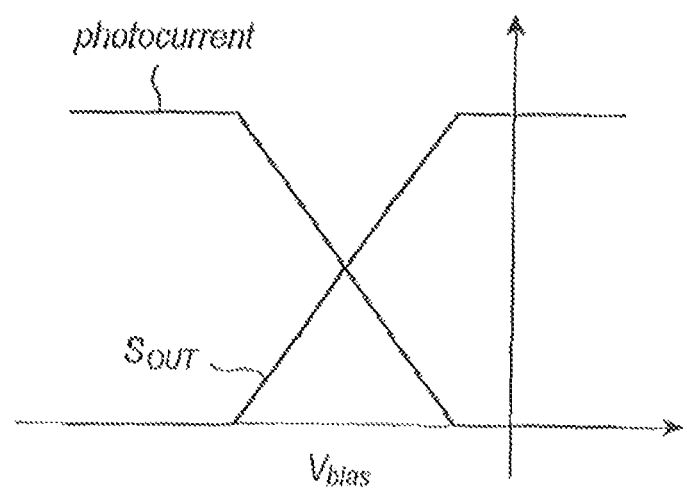

FIG. 3A schematically shows a relation between the bias current $I_{bias}$ and the optical output of the DFB 3. The DFB 3 may emit light $S_{DC}$ whose amplitude is proportional to the bias current $I_{bias}$ when the bias current $I_{bias}$ exceeds a threshold current $I_{th}$. FIG. 3B schematically shows a relation of the optical output $S_{OUT}$ and the photocurrent $I_{photo}$ against the bias voltage $V_{bias}$ applied between the anode and cathode of the EA 5. Increasing the bias voltage $V_{bias}$ negatively, the optical output $S_{OUT}$ decreases by the increment of the absorption of light, then the photocurrent $I_{photo}$ increases. On the other hand, decreasing the bias Voltage $V_{bias}$ negatively, the optical output $S_{OUT}$ from the EA 5 increases to decrease the absorption thereat, then, the photocurrent $I_{photo}$ decreases. However, the optical output $S_{OUT}$ or the photocurrent $I_{photo}$ saturates in extreme conditions, a large negative or around zero of the bias voltage $V_{bias}$. The photocurrent $I_{photo}$ shows dependence in inverse to the optical output $S_{OUT}$ against the applied bias voltage $V_{bias}$ because the photocurrent $I_{photo}$ is caused by the optical absorption.

Referring back to FIG. 1, the operation of the driver 1 will be described. Assuming conditions that the complementary signals $V_{INP}$ and $V_{INN}$ applied to respective MOSFETs, 21 and 25, fully turn of and on the MOSFETs 21 and 25, respectively; no voltage drop is caused in the resistor 19 because no current flows in the first MOSFET 21, or the first current path 15. Then, no bias voltage $V_{bias}$ is applied to the EA 5, which causes substantially no absorption of the light $S_{DC}$ thereat to transmit almost all of the continuous light $S_{DC}$ as the optical output $S_{OUT}$ of the EA 5.

When the signal $V_{INN}$ fully turns on the first MOSFET 21 while the other signal $V_{INP}$ fully turns off the second MOSFET 25, the bias current $I_{bias}$ in the whole portion thereof flows in the resistor 19 to cause a bias voltage $V_{bias}$ thereat. The bias $V_{bias}$ thus caused is inversely proportional to the resistance of the resistor 19 and the parasitic resistance of the EA 5. The bias voltage $V_{bias}$ may activate the EA 5 to absorb a portion of the light $S_{DC}$ and to generate the photocurrent $I_{photo}$. The sum of the currents $I_{bias}+I_{photo}$ flows in the first MOSFET 21. Thus, the driver 1 may generate the modulated light $S_{OUT}$.

First Embodiment

Figure 4:
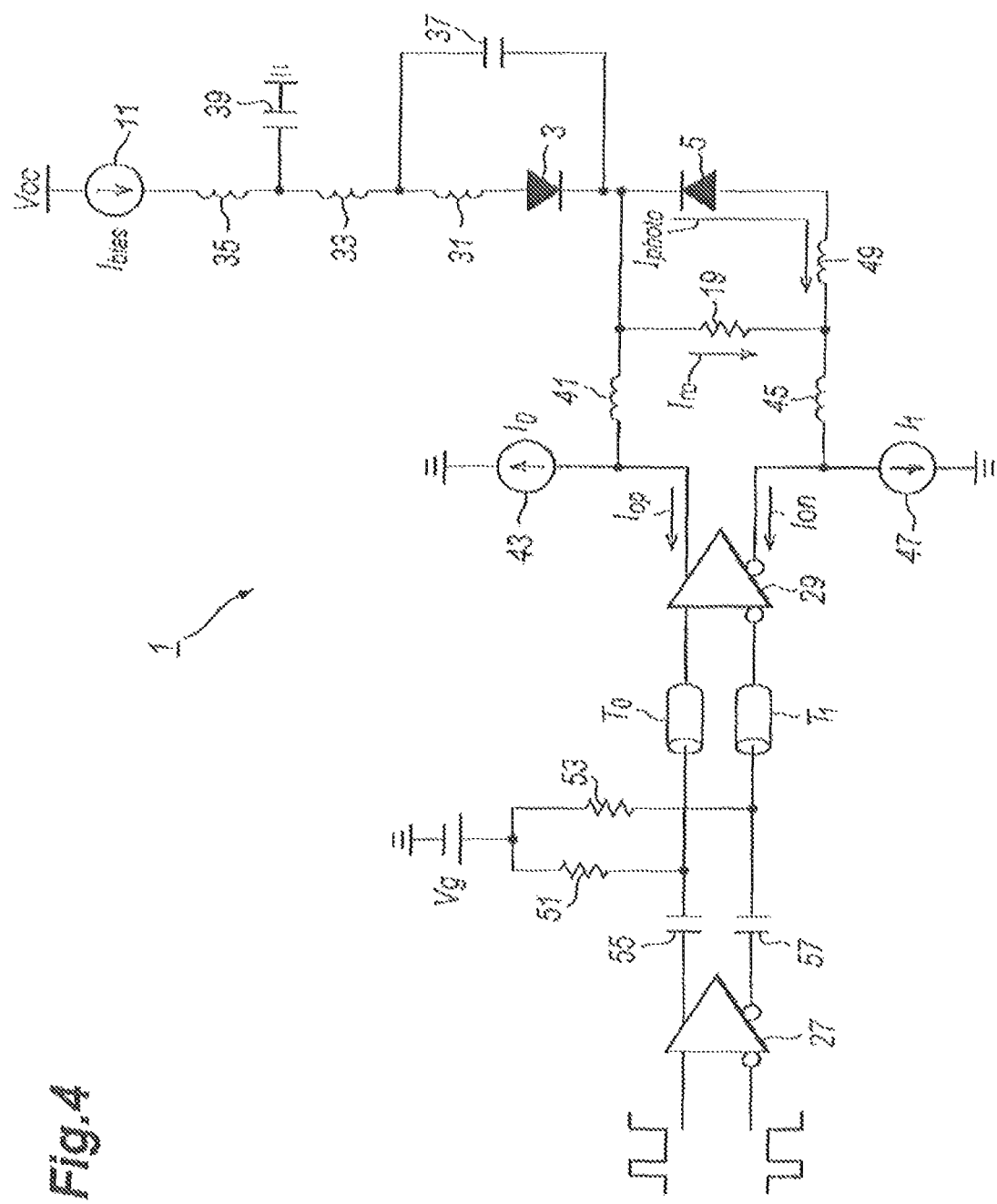
FIG. 4 is a circuit diagram of a driver for an EA-DFB according to an embodiment of the invention.

FIG. 4 shows a circuit diagram of a driver 1 according to the first embodiment of the invention. The EA-DFB driver 1 shown in FIG. 4 may include an LD driver 27 and an amplifier 29. The amplifier 29, which is the type of the trans-conductance amplifier configured with an integrated circuit (IC), may be implemented within a package for an optical transmitter, with an EA-DFB element. The trans-conductance amplifier 29 may suppress the power consumption and the output swing voltage of the LD driver 27.

The anode of the DFB 3 is coupled with the positive power supply Vcc via inductors, 31 to 35. A capacitor 39 put between the inductors, 33 and 35, denotes the parasitic components attributed to interconnections between the package and power supply Vcc. Another capacitor 37 is implemented in parallel to the DFB 3 to bypass high frequency components contained in the bias current $I_{bias}$ supplied to the DFB 3.

The resistor 19 in one of the terminals thereof is coupled with the cathode of the EA 5, and the non-inverting output of the amplifier 29 and the current source 43 via the inductor 41. The current source 43 bypasses the current flowing in the second MOSFET 25. The other terminal of the resistor 19 is coupled with the anode of the EA 5 via the inductor 49, and the other current source 47 and the inverting output of the amplifier 29 via an inductor 45. The current source 47 may bypass a current flowing in the first MOSFET 21. The resistor 19 has functions of: to equivalently reduce a resistive component of the parasitic resistance connected in parallel to the parasitic capacitance of the EA 5, which may enable modulation of the EA 5 in higher frequencies, and to generate the bias voltage $V_{bias}$ applied between the anode and cathode of the EA 5.

The trans-conductance amplifier 29, which corresponds to the switching unit 13 in FIG. 1 and has the configuration of the differential input and the differential output, may provide the differential current to the parallel circuit of the resistor 19 and the EA 5 by receiving the differential signal from the LD driver 27. Two inputs of the trans-conductance amplifier 29 are biased by the voltage source Vg via respective resistors, 51 and 53, and transmission lines, $T_0$ and $T_1$. Two resistors, 51 find 53, have the resistance thereof enough large, for instance at least 10 kΩ, not to affect the impedance of the transmission lines, $T_0$ and $T_1$, but may be replaced by inductors. Two outputs of the LD driver 27 are coupled with the inputs of the trans-conductance amplifier 29 via capacitors, 55 and 57, and transmission lines, $T_0$ and $T_1$, to provide signals complementary to each other.

In the driver 1 shown in FIG. 4, the following relation regarding the current flow may be defined based on the current continuity, that is:

$$I_{bias}=I_0+I_{OP}+I_{ro}+I_{photo}, \text{ and}$$

$$I_{ro}+I_{photo}=I_1+I_{ON},$$

where $I_0$ and $I_1$ are the currents by the current sources, 43 and 47; $I_{OP}$ and $I_{OP}$ are the currents flowing within the differential outputs of the trans-conductance amplifier 29, and $I_{ro}$ is the current flowing in the resistor 19, respectively.

Figure 5:
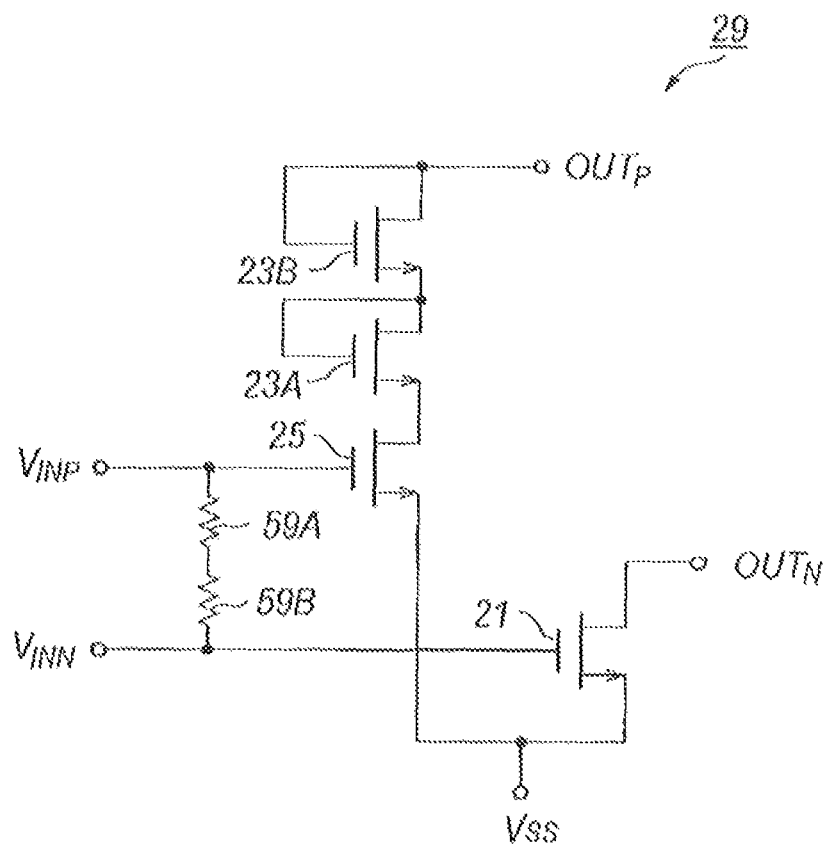
FIG. 5 is a circuit diagram of an example of a trans-conductance amplifier, or a switching unit, shown in FIG. 4.

FIG. 5 shows a circuit diagram of on example of the trans-conductance amplifier 29. The circuit shown in FIG. 5 is substantially same with those shown in FIG. 1. Two inputs, $Y_{INP}$ and $V_{INN}$, are coupled with two resistors, 59A and 59B, whose resistance are set to be 50Ω. The negative power supply $V_{SS}$ may be set to the ground. Two MOSFETs, 23A and 23B, are put between the positive output $OUT_P$ and the second MOSFET 25, where two MOSFETs, 23A and 23B, are configured with the diode connection. The driver 1 shown in FIG. 1 provides one MOSFET 23 with the diode connection, while, the trans-conductance amplifier 29 shown in FIG. 5 has two MOSFETs, 23A and 23B, each configured with the diode connection. This is because the EA 5 is necessary to be enough biased and such a condition corresponds to the voltage drop caused by two MOSFETs each configured with the diode connection. Thus, two MOSFETs, 21 and 25, may be operable in the differential mode, that is, the bias conditions of respective terminals of the MOSFETs, 21 and 25, become substantially equivalent to the others.

The voltage difference caused in two outputs of the trans-conductance amplifier 29, $OUT_P$ and $OUT_N$, may be adjustable by the currents, $I_0$ and $I_1$, derived from respective current sources, 43 and 47, and the resistance ro of the resistor 19. Because the latter is kept constant to ro, men two currents, $I_0$ and $I_1$, may be adjustable for the voltage difference appeared between two outputs, $OUT_N$ and $OUT_P$. Specifically, when two currents, $I_0$ and $I_1$, and the resistance ro are 19 mA, 27 mA and 50Ω, respectively; the level of the terminal ComC common to the DFB 3 mid the EA 5, and that of the anode of the EA 5 are 3.2 V and 1.44 V, respectively, then the EA 5 is reversely biased by 1.76V ($V_{bias}=V_{ComC}-V_{EAA}$)=1.76V. Adjusting the input bias Vg applied to respective gates of two MOSFETS, 21 and 25, which varies me output currents, $I_{OP}$ and $I_{ON}$, of the trans-conductance amplifier 29, the bias voltage $V_{bias}$ applied to the EA 5 is resultantly shifted. However, the gate bias Vg is set to be constant to an empirical optimum level of 0.95 V.

Figure 6A:
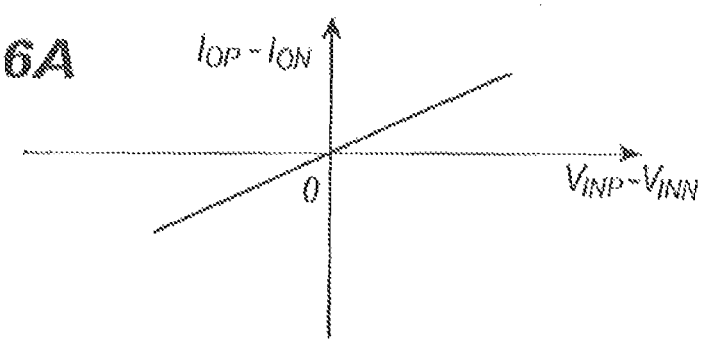
FIGS. 6A to 6D show relations of $I_{OP}-I_{ON}$, $I_{ro}$, $I_{ro} \times ro$ and $S_{OUT}$ against the differential input of the trans-conductance amplifier.
Figure 6B:
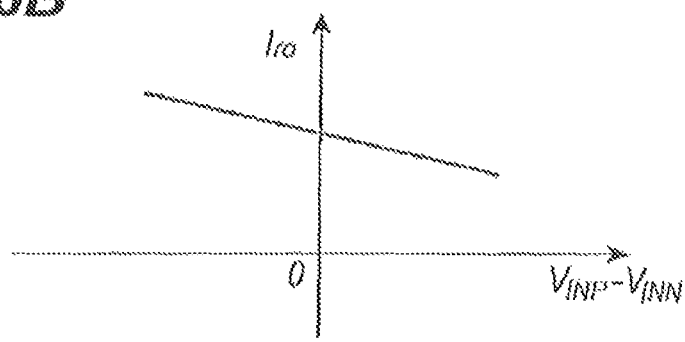
Figure 6C:
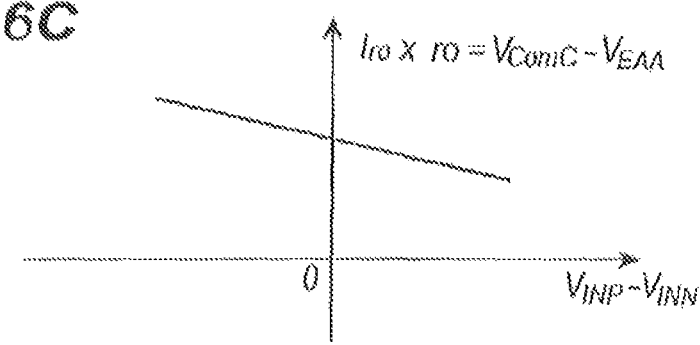
Figure 6D:
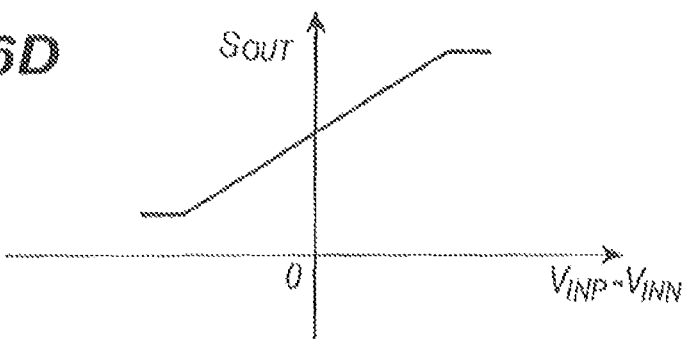

FIGS. 6A to 6D show relations of the optical output against the inputs, $V_{INP}$ and $V_{INN}$, of the trans-conductance amplifier 29. As shown in FIG. 6A, a difference of two output currents, $I_{OP}-I_{ON}$, is proportional to a difference of two inputs, $V_{INP}-V_{INN}$, of the amplifier 29, that is, the differential current $I_{OP}-I_{ON}$ linearly increases as the differential inputs, $V_{INP}-V_{INN}$, increases. Referring to FIG. 6B, when the positive output current $I_{OP}$ increases while, the negative output current $I_{ON}$ decreases, the resistor current $I_{ro}$ decreases. Then, as shown in FIG. 6C, decreasing the resistor current $I_{ro}$, which results in a decrease of the reverse bias $V_{ComC}-V_{EAA}$ applied to the EA 5, the optical output $S_{OUT}$ increases to show the state "1", FIG. 6D. On the other hand, when the differential input $V_{INP}-V_{INN}$ decreases, the differential output current $I_{OP}-I_{ON}$, the resistor current $I_{ro}$, the bias voltage, $V_{ComC}-V_{EAA}$, and the optical output $S_{OUT}$ behave inverse to those described above. The optical output $S_{OUT}$ shows the state "0".

Next, the power consumption of the driver 1 will be evaluated. The bios current $I_{bias}$ is assumed to be 85 mA, although it depends on the inherent characteristics of the EA-DFB device. The positive power supply Vcc is set to be about 5.0 V, which is a sum of 3.2 V for the level $V_{ComC}$ of the common node, about 1.3 V of the forward, bias voltage for the DFB 3, and about 0.5 V for a bias necessary to operate the bias current source 11. Thus, the positive power supply Vcc becomes large compared to those of the conventional drivers because the cathode level common to the DFB 3 and the EA 5 is floating. On the other hand, the power consumption by the LD driver 27 may be suppressed to about 170 mW because the output swing thereof may be reduced. The photocurrent $I_{photo}$ generated by the EA 5 does not directly flow into the ground but all of which may be regarded as a portion of the bias current $I_{bias}$, then the total power consumption of the driver 1 becomes, 5.0(V)×85 (mA)+170 (mW)~600 (mW)

Figure 7A:
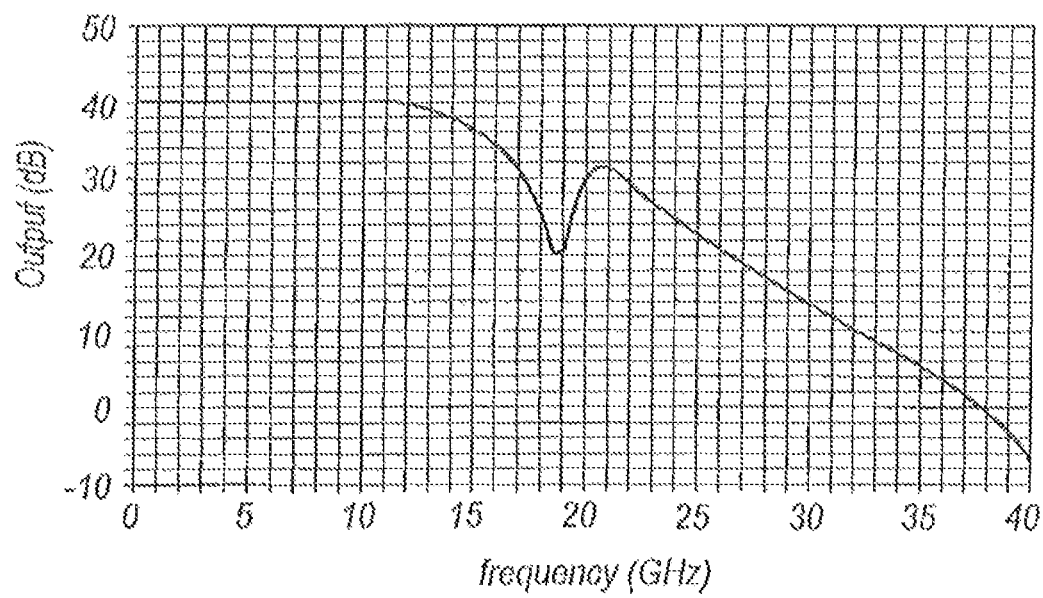
FIG. 7A shows a frequency characteristic of the driver and FIG. 7B shows an example of an eye diagram thereof.
Figure 7B:
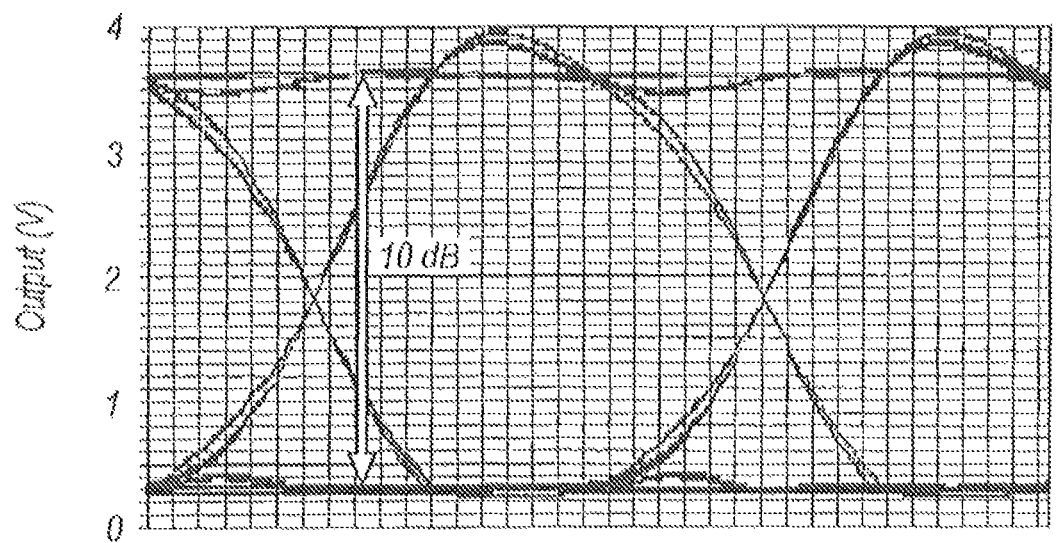

FIG. 7A shows a frequency response, while, FIG. 7B shows the optical output of the driver 1. The nMOSFET implemented with the circuit shown in FIG. 5 has a gate width of 0.18 μm. The operable frequency range of the driver, which may be determined by a frequency at which the gain, or the conductance thereof, decreases by 3 dB compared with a substantially flat level in a lower frequency region, reaches to about 14.7 GHz. A large dip appears around 19 GHz due to a resonance by the capacitor 39 and the inductor 33, which restricts the high frequency response of the driver 1. FIG. 7B shows an eye diagram of the optical output of the driver 1 at the speed of 11.3 Gbps. As shown in FIG. 7B, the driver may show an excellent performance in the optical output thereof with the extinction ratio of about 10 dB and the enough opening in the eye diagram when the input swing voltage is 500 mVpp.

The driver 1 for a DFB with an external modulator provides the bias current $I_{bias}$ to the DFB 3 in the DC mode, while, the bias current is intermittently provided in an reversed phase to the resistor 19 connected in parallel to the EA 5, which may drive the EA 5 to modulate the light $S_{DC}$ coming from the DFB 3. The EA 5 and the resistor 19 are driven primarily by the trans-conductance amplifier 29, the LD driver 27 set in the upstream of the amplifier 29 may suppress the output swing voltage, which may lower the power consumption thereof.

Figure 9:
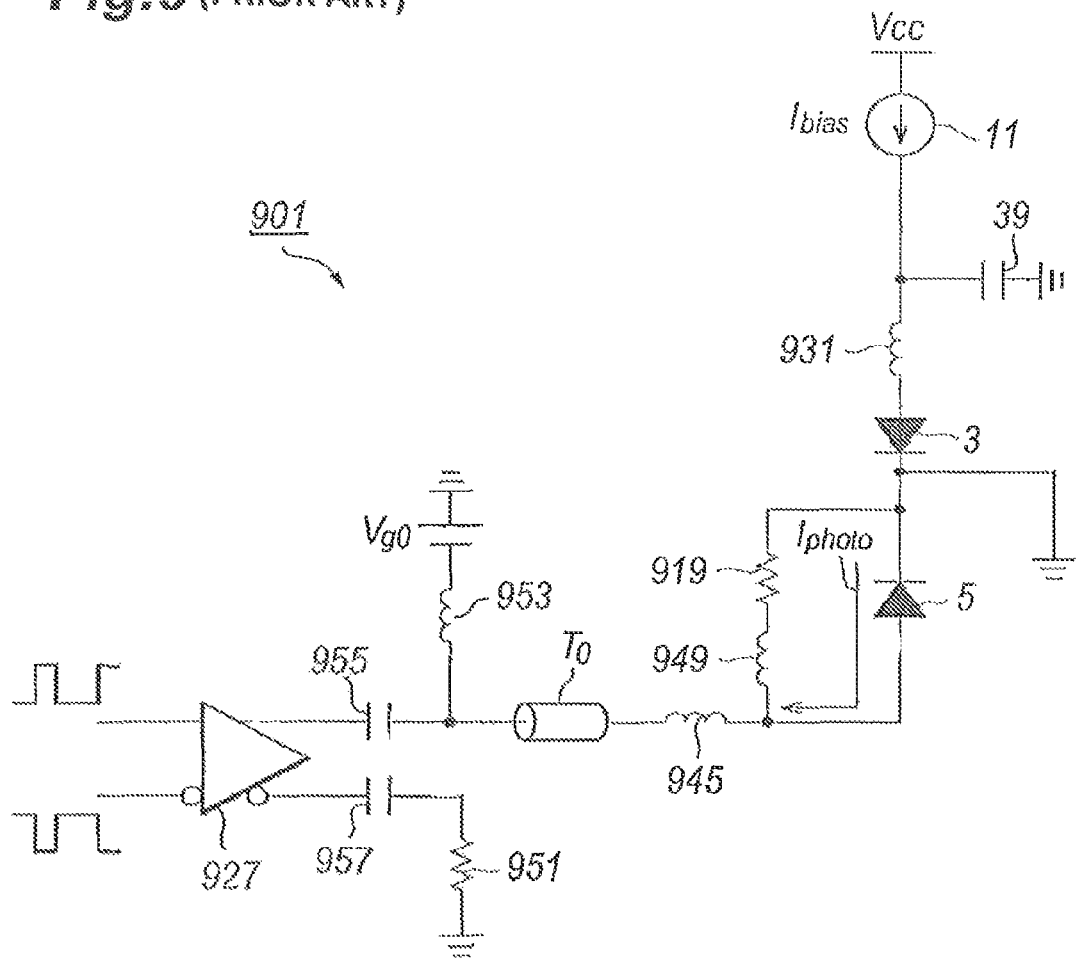
FIG. 9 is a circuit diagram of a conventional driver for an EA-DFB.

In a conventional driver 901 shown in FIG. 9, the node ComC common to the cathode of the DFB 3 and the EA 5 is grounded, while, the anode DFB-A of the DFB 3 is coupled with the bias source 11 via the inductor 931. The bias current $I_{bias}$ provided therefrom flows in the inductor 931 and the DFB 3 to be sunk in the ground. Moreover, a termination resistor 951 with the resistance of 50 Ω coupled with the inverting output of the driver 927 via the capacitor 957 as the EA 5 is coupled with the non-inverting output of the driver 927 via the capacitor 955, the transmission line $T_0$, and another inductor 945. Thus, the EA 5 and the termination resistor 951 are connected in parallel to the driver 927. The termination resistor 951 is generally realized by a thin film resistor formed on a carrier on which the EA-DFB is also mounted. The EA 5 is necessary to be negatively biased to activate the EA 5 as an optical modulator. Accordingly, a voltage source Vg0 provides a negative bias to the anode of the EA 5 via the inductor 953. The LD driver 927, receiving signals complementary to each other in the inputs thereof, may output signals also complementary to each other, one of which is provided to the anode of the EA 5, while the other is merely provided to the termination resistor 951.

The power consumption of the driver 901 when the power supply Vcc is set to be Vcc=3.3 V will be evaluated. Because the EA 5 is driven in the single phase mode, the modulation signal with over 2 Vpp is necessary, which is equivalent to the modulation current of 80 mA from a simple equation of (2 V)$^2$/50 Ω=80 mA. Estimating the supply current for the amplifying section in the LD driver 927 to be about 50 to 60 mA, the power consumed by the LD driver 927 becomes about 450 mW. The bias currently for the DFB 3 is typically about 85 mA, the power consumption in the DFB 3 becomes about 264 mW, In addition to the above, the photo current $I_{photo}$ flows from the ground to the anode EAA of the EA 5, which causes the power consumption of about 30 mW. Then, a total of about 744 mW is consumed by the driver 901. Comparing the power consumption of the conventional driver 901 with the embodiment shown in FIG. 4, the driver 1 according to the embodiment may save the power consumption thereof by about 20%.

When the EA-DFB is driven in the differential mode, the cathode of the DFB 3 is necessary to be enough stabilized to realize a stable operation thereof. Then, a voltage drop caused in the parallel circuit of the EA 5 and the resistor 19 is necessary to be substantially equal to the bias voltage, between the drain and the source of the MOSFET 23. The former voltage drop is primarily determined by the current flowing in the resistor 19 substantially independent of the photocurrent $I_{photo}$. Accordingly, additional current sources, 43 and 47, may adjust the current $I_{ro}$ flowing in the resistor 19 to set the voltage drop thereby equal to the bias between the drain and the source of the MOSFET 23. Thus, the DC operation of the DFB 3 may be stabilized.

In an embodiment, the latter voltage drop described above may be realized by two MOSFETS, 23A and 23B, connected in series to each other and each being configured with the diode connection. These MOSFETS, 23A and 23B, may equalize the drain to source bias of the first MOSFET 21 and the second MOSFET 25. The capacitor 37 connected in parallel to the DFB 3 may further stabilize the bias between the anode and the cathode of the DFB 3.

In the foregoing detailed description, the driver circuit of the present invention have been described with reference to specific exemplary embodiments thereof. It will, however, be evident that various modifications and changes may be made thereto without departing from the broader spirit and scope of the present invention.

Figure 8:
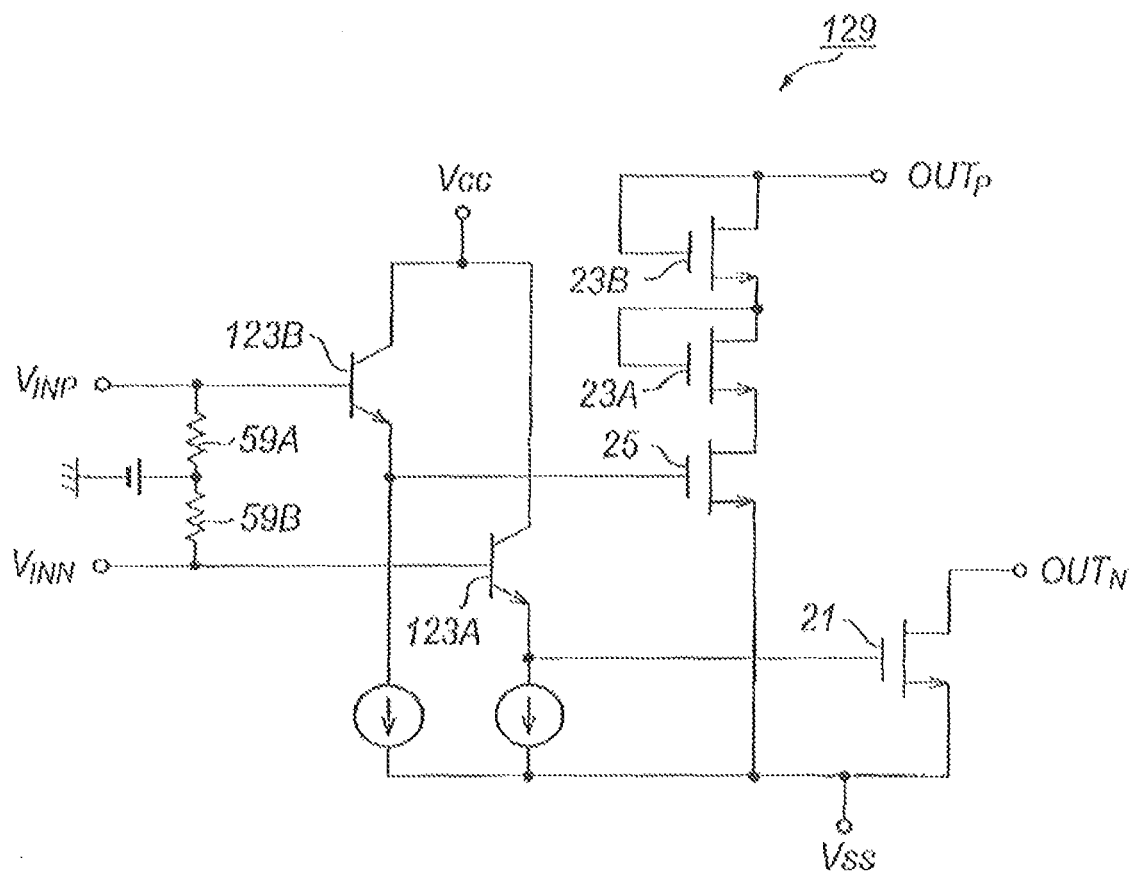
FIG. 8 is a circuit diagram of a tarns-conductance amplifier according to another embodiment of the invention.

For instance, although FIG. 5 shows one embodiment of the trans-conductance amplifier, the arrangement of the amplifier 29 may be varied and modified. Another arrangement of the trans-conductance amplifier 129 is shown in FIG. 8, where the amplifier 129 adds an emitter follower for respective inputs thereof as the input buffer to the primary arrangement shown in FIG. 5. The input buffer or the emitter follower constituted by bipolar transistors of the SiGe type may sufficiently drive the MOSFET. The trans-conductance amplifier 129 forces the size of the paired MOSFETs, 21 and 25, to be large, which inevitably increases the parasitic capacitance, Cgs, Cgd, and Cox, around the MOSFETs, 21 and 25. These parasitic, capacitors degrade the frequency response of the amplifier 129. The emitter follower constituted by the bipolar transistors, 123A and 123B, connected in the upstream of the MOSFETS, 21 and 25, may compensate the degradation in the high frequency performance of the amplifier 129.

The common cathode of the DFB 3 and the EA 5 may be bypassed to the ground or the power supply Vcc with a capacitor to stabilize the operation of the DFB 3 further. In a modification, the trans-conductance amplifier 29 may include a feedback to keep the level of the common cathode in constant by adjusting the DC bias provided to the MOSFETs, 21 and 25, depending on the detection of the level of the common cathode. Thus, the present specification and figures are accordingly to be regarded as illustrative rather than restrictive.

What is claimed is:

1. A driver circuit for an EA-DFB light-emitting device including a semiconductor laser diode (LD) with a type of a distributed feedback laser (DFB) integrated with an electro-absorption modulator (EA), said driver circuit comprising:
   a common cathode common to the LD and the EA, the common cathode electrically floating from the ground,
   a bias current source connectible between a relatively high voltage and the common cathode, the bias current source providing a bias current to the LD,
   a switching unit connectible between the common cathode and a relatively low voltage, the switching unit including a first current path and a second current path, the first current path including a resistor connected in parallel to the EA and a first transistor, the second current path including a second transistor and a diode connected in series to the second transistor, the first transistor and the second transistor being driven complementally and switching a modulation current,
   a first current source connected in parallel to the first transistor, the first current source draining a first bypass current through the resistor,
   a second current source connected in parallel to the second current path, the second current source draining a second bypass current from the common cathode,
   wherein the second current source is configured so that the bias current is equal to a sum of the first bypass current, the modulation current, and the second bypass current.

2. The driver of claim 1,
wherein the diode has a resistance substantially equal to a resistance of the resistor.

3. The driver of claim 1,
wherein the first and second transistors are fully turned on or off.

4. The driver of claim 1,
further including a bypass capacitor connected in parallel to the LD.

5. The driver circuit of claim 1,
wherein a voltage drop of the diode is substantially equal to a bias voltage between the common cathode and an anode of the EA.

6. The driver circuit of claim 5,
wherein the bias voltage is caused by the first bypass current flowing in the resistor.

7. The driver circuit of claim 6,
wherein the diode is a n-type MOSFET, where the gate thereof is connected to the drain thereof to configure the MOSFET as the diode.

8. The driver circuit of claim 7,
wherein the negative power supply is set to ground.

9. The driver circuit of claim 1,
wherein the diode is a n-type MOSFET, where the gate thereof is connected to the drain thereof to configure the MOSFET as the diode.

10. The driver circuit of claim 9,
wherein the negative power supply is set to ground.

11. The driver circuit of claim 1,
wherein the negative power supply is set to ground.

* * * * *